United States Patent
Jan et al.

(10) Patent No.: US 10,002,820 B2
(45) Date of Patent: Jun. 19, 2018

(54) THROUGH SILICON VIA LAYOUT PATTERN

(75) Inventors: Sun-Rong Jan, New Taipei (JP);
Che-Yu Yeh, New Taipei City (TW);
Chee Wee Liu, Taipei (TW);
Chien-Hua Huang, Zhubei (TW); Bing J. Sheu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 556 days.

(21) Appl. No.: 13/478,815

(22) Filed: May 23, 2012

(65) Prior Publication Data
US 2013/0221534 A1   Aug. 29, 2013

Related U.S. Application Data

(60) Provisional application No. 61/604,429, filed on Feb. 28, 2012.

(51) Int. Cl.
*H01L 23/48*  (2006.01)
*H01L 23/52*  (2006.01)
*H01L 29/40*  (2006.01)

(52) U.S. Cl.
CPC .... *H01L 23/481* (2013.01); *H01L 2924/0002* (2013.01)

(58) Field of Classification Search
CPC ............. H01L 2924/0002; H01L 23/481
USPC ........................................ 257/774
See application file for complete search history.

(56) References Cited

U.S. PATENT DOCUMENTS

| 5,981,880 | A  | * | 11/1999 | Appelt ............... H01L 21/481 174/258 |
| 2004/0212073 | A1 | * | 10/2004 | Divakar ............ H01L 23/3677 257/698 |
| 2009/0212438 | A1 |   | 8/2009  | Kreupl et al. |
| 2010/0140749 | A1 | * | 6/2010  | Kuo ...................... H01L 23/481 257/621 |
| 2010/0171226 | A1 |   | 7/2010  | West et al. |
| 2011/0272818 | A1 | * | 11/2011 | Jeong ........................... 257/774 |
| 2012/0007132 | A1 | * | 1/2012  | Chang .................. H01L 21/486 257/99 |
| 2012/0139127 | A1 | * | 6/2012  | Beyne ........................ 257/774 |
| 2012/0313247 | A1 | * | 12/2012 | Yu ........................ H01L 24/05 257/763 |
| 2012/0319248 | A1 | * | 12/2012 | Rahman ............... H01L 23/147 257/621 |
| 2013/0049220 | A1 | * | 2/2013  | Hsieh ............... H01L 21/76898 257/774 |
| 2013/0115769 | A1 | * | 5/2013  | Yu et al. ..................... 438/667 |

(Continued)

FOREIGN PATENT DOCUMENTS

DE    19933471 A1    2/2001

*Primary Examiner* — Joseph C Nicely
*Assistant Examiner* — Wilner Jean Baptiste
(74) *Attorney, Agent, or Firm* — Slater Matsil, LLP

(57) ABSTRACT

A semiconductor device comprises a substrate with a first side and a second side, wherein a plurality of active circuits are formed adjacent to the first side of the substrate and a plurality of through silicon vias arranged in a polygon shape and extending from the first side of to the second side, wherein the polygon shape has more than six sides, and wherein each through silicon via is placed at a corresponding apex of the polygon shape.

20 Claims, 8 Drawing Sheets

(56) References Cited

U.S. PATENT DOCUMENTS

2013/0147049 A1\* 6/2013 Wang ..................... H01L 22/32
257/773

\* cited by examiner

THROUGH SILICON VIA LAYOUT PATTERN

This application claims the benefit of U.S. Provisional Application No. 61/604,429, filed on Feb. 28, 2012, entitled "Through Silicon Via Layout Pattern," which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, three dimensional integrated circuits have emerged as an effective alternative to further reduce the physical size of a semiconductor chip. In a three dimensional integrated circuit, active circuits such as logic, memory, processor circuits and the like are fabricated on different wafers and each wafer die is stacked on top of a packaging component using pick-and-place techniques. Through silicon vias provide connections between different wafers stacked together. Much higher density can be achieved by employing three dimensional integrated circuits. In sum, three dimensional integrated circuits can achieve smaller form factors, cost-effectiveness, increased performance and lower power consumption.

Through silicon vias in three dimensional integrated circuits may be fabricated by suitable techniques. For example, an opening may be formed on a first side (e.g., the active side) of a substrate. The bottom of the opening is deeper than active circuits of the substrate. Conductive materials such as copper may be filled in the opening. Then, a thinning process is performed on a second side (e.g., the backside) of the substrate until the conductive material is exposed. As such, a through silicon via is formed. One advantageous feature of three dimensional integrated circuits is that parasitic losses are reduced by employing through silicon vias.

Due to the mismatch between the coefficient of thermal expansion (CTE) of copper and the CTE of silicon, there may be a concentration of stress in the areas adjacent to a through silicon via opening. Such a concentration of stress may lead to reliability problems such as cracking. In addition, the through silicon via induced stress may cause performance degradation if active circuits such as transistors are formed in the adjacent areas of the through silicon via opening. In order to obtain reliable and high performance transistors, the area adjacent to a through silicon via is defined as a keep-out zone for active circuits. There is a need to reduce the size of the keep-out zone so that the active circuit density of a wafer may be increased as a result.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a layout pattern for through vias in three dimensional integrated circuits. The embodiments of the disclosure may also be applied, however, to a variety of interconnect vias of semiconductor devices. Hereinafter, various embodiments will be explained in detail with reference to the accompanying drawings.

Figure 1A:
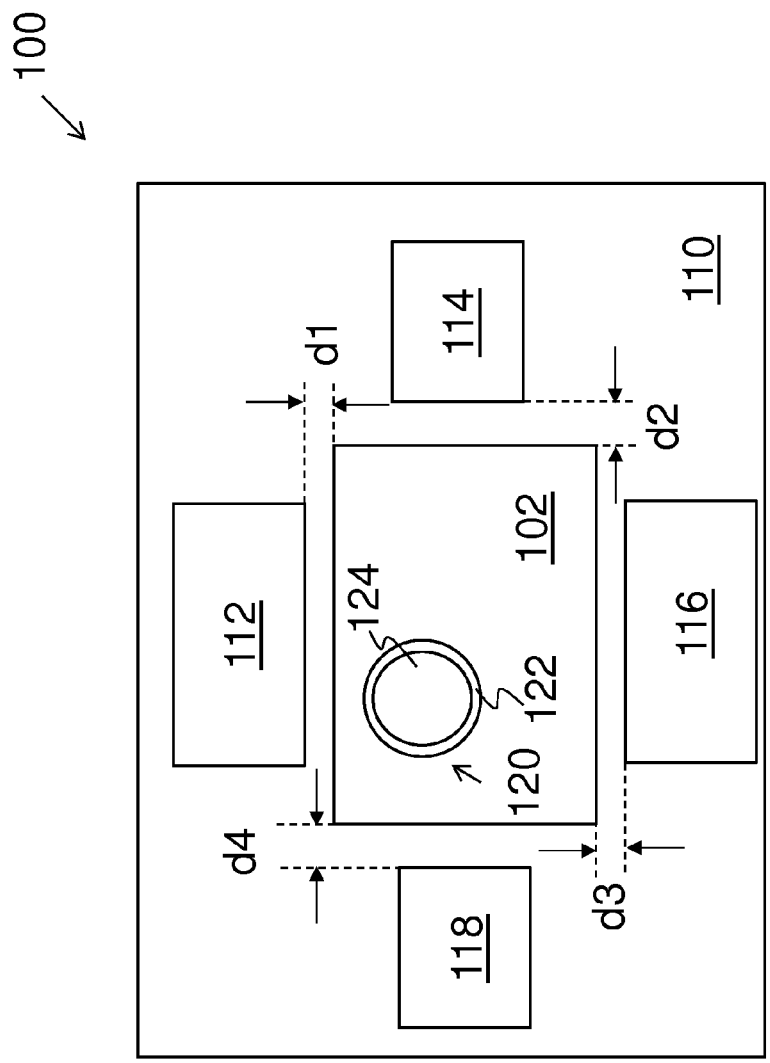
FIG. 1A illustrates a top view of a semiconductor device in accordance with an embodiment.

FIG. 1A illustrates a top view of a semiconductor device in accordance with an embodiment. The semiconductor device 100 is formed in a substrate 110. The substrate 100 may be formed of silicon, although it may also be formed of other group III, group IV, and/or group V elements, such as silicon, germanium, gallium, arsenic, and combinations thereof. The substrate 100 may also be in the form of bulk substrate or silicon-on-insulator (SOI) substrate. Integrated circuit devices such as transistors, capacitors, resistors, and the like, are formed at the top surface of the substrate 100.

The semiconductor device 100 may comprise a plurality of through vias extending vertically from the bottom side of the semiconductor device to one of metal interconnect layers (not shown) on the active side of the semiconductor device 100. Throughout the description, the through vias may be referred to as through silicon vias, or more general, as through substrate vias. It should be noted that through vias are merely an example and is not meant to limit the current embodiments. Any suitable interconnect vias providing connections between two sides of a semiconductor wafer are fully intended to be included within the scope of the embodiments discussed herein throughout the description.

As shown in FIG. 1A, through silicon vias (e.g., through silicon via 120) may form a through silicon via array 102. Adjacent to the through silicon via array 102, there may be a first active circuit region 112, a second active circuit region 114, a third active circuit region 116 and a fourth active circuit region 118. It should be noted while FIG. 1A illustrates four active regions, the semiconductor device 100 may accommodate any number of active regions. It should further be noted that each active region may include hundreds of transistors. The number of active regions illustrated herein is limited solely for the purpose of clearly illustrating the inventive aspects of the various embodiments. The various embodiments are not limited to any specific number of active regions.

The active regions (e.g. first active region 112) may comprise a plurality of transistors. However, as one of skill in the art will recognize, a wide variety of active devices such as capacitors, resistors, inductors and the like may be used to generate the desired structural and functional requirements of the design for the semiconductor device 100. The active regions (e.g., the first active region 112) may be formed using any suitable methods either within or on the first side of the substrate 110.

Each through silicon via (e.g., through silicon via 120 shown in FIG. 1A) comprises an opening 124 and a liner 122. The through silicon via opening 124 may be formed by applying and developing a suitable photoresist (not shown), and removing the substrate 110 that is exposed to the desired depth. The through silicon via opening 124 may be formed so as to extend into the substrate 110 at least further than the active devices (e.g., active devices in the first active region 112) formed within and/or on the substrate 110. In particular, the through silicon via opening 124 may extend to a depth greater than the eventual desired height of the substrate 110.

Once the through silicon via opening 124 has been formed within the substrate 110, the through silicon via opening 124 may be lined with the liner 122 as shown in FIG. 1A. The liner 122 may be any suitable insulation materials such as an oxide formed from tetraethylorthosilicate (TEOS) or silicon nitride, although any suitable dielectric material may alternatively be used. The liner 122 may be formed using a plasma enhanced chemical vapor deposition (PECVD) process, although other suitable processes, such as physical vapor deposition or a thermal process, may alternatively be used.

Once the liner 122 has been formed along the sidewalls and bottom of the through silicon via opening 124, a barrier layer (not shown) may be formed and the remainder of the through silicon via opening 124 may be filled with a conductive material. The conductive material may comprise copper, although other suitable materials such as aluminum, alloys, doped polysilicon, combinations thereof, and the like, may alternatively be utilized. The conductive material may be formed by electroplating copper onto a seed layer (not shown), filling and overfilling the through silicon via opening 124.

Once the through silicon via opening 124 has been filled, excess conductive material on top of the through silicon via opening 124 may be removed by any suitable removal processes such as a planarization process such as chemical mechanical polishing (CMP) process. In addition, a thinning process may be applied to the backside of the substrate 110 until the conductive material is exposed. As a result, the through silicon via 120 is formed.

The openings of through silicon vias may be filled with conductive materials such as copper. Copper has a higher coefficient of thermal expansion (CTE) as compared to substrate materials such as silicon adjacent to through silicon vias. During a temperature change process such as thermal cycling and the like, there may be a concentration of stress due to the CTE mismatch between copper and silicon at the areas adjacent to through silicon vias. Such a through silicon via induced stress may have an impact on the reliability and performance of transistors placed in the areas adjacent to through silicon vias.

In order to improve the reliability of the semiconductor device 100, a keep-out zone may be employed to define the placement area available for active regions (e.g., the first active region 112). As shown in FIG. 1A, in accordance with an embodiment, the keep-out zone can be defined as the minimum distance between the through silicon via array 102 and one of its adjacent active regions. For example, as shown in FIG. 1A, there is a distance d1 between the first active region 112 and the through silicon via array 102. The distance d1 represents the minimum distance between the active region 112 and the through silicon via array 102. A smaller d1 is desirable because more transistors may be placed in the substrate 110. Likewise, d2, d3 and d4 represent the minimum distance between other active regions and the through silicon via array 102.

In order to reduce the keep-out zone of the through silicon via array 102, through silicon via induced stress should be reduced. In accordance with an embodiment, through silicon via induced stress may be reduced by placing through silicon vias in a particular layout pattern. The detailed layout patterns for reducing through silicon via induced stress will be described below with respect to FIGS. 2-5.

Figure 1B:
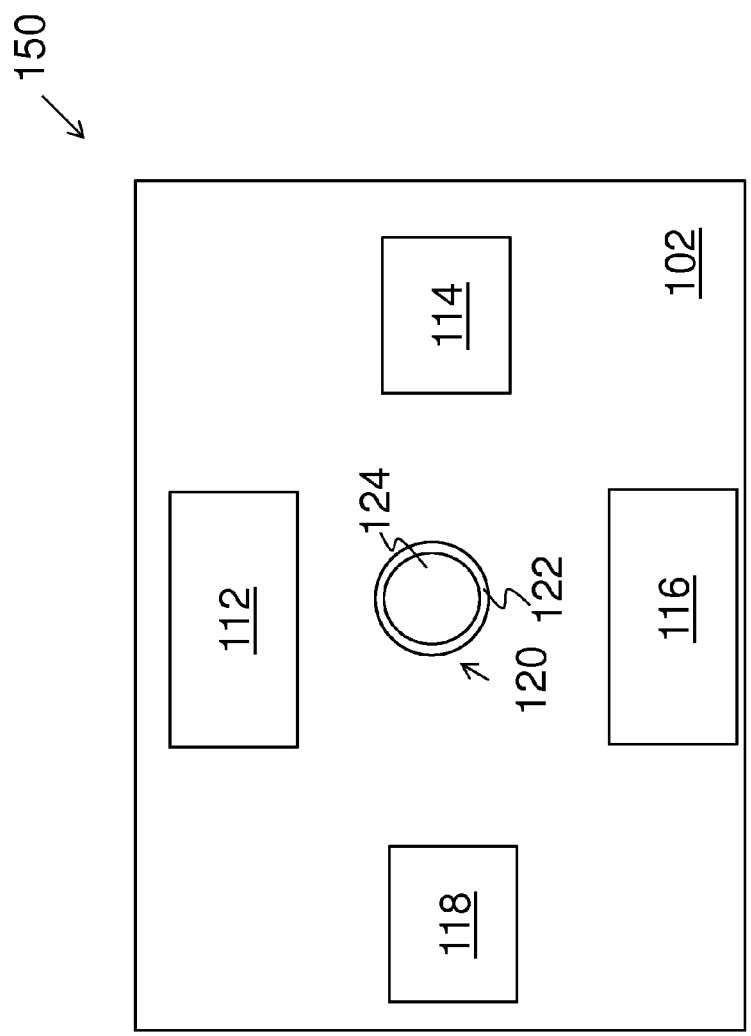
FIG. 1B illustrates a top view of a semiconductor device in accordance with another embodiment.

FIG. 1B illustrates a top view of a semiconductor device in accordance with another embodiment. The semiconductor device 150 shown in FIG. 1B is similar to the semiconductor device 100 shown in FIG. 1A except that the active regions (e.g., the first active region 112) are formed inside the through silicon via array 102. In other words, a person skilled in the art will recognize that the disclosure is applicable to the semiconductor device 100 shown in FIG. 1A as well as the semiconductor device 150 shown in FIG. 1B.

Figure 2:
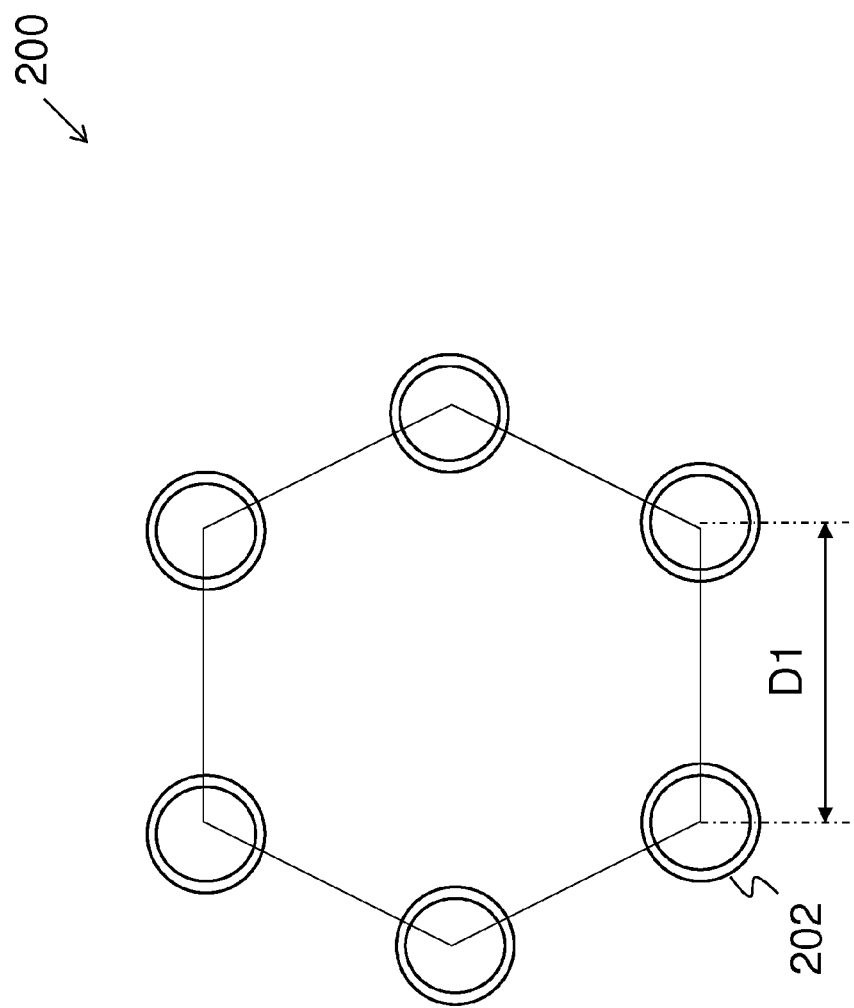
FIG. 2 illustrates a hexagonal layout pattern of through silicon vias in accordance with an embodiment.

FIG. 2 illustrates a hexagonal layout pattern of through silicon vias in accordance with an embodiment. The layout pattern 200 includes six through silicon vias (e.g., through silicon via 202) arranged in a hexagonal shape. In particular, as shown in FIG. 2, six through silicon vias are arranged at the six apexes of the hexagon respectively. In accordance with an embodiment, through silicon vias (e.g., through silicon via 202) has a diameter in a range from about 1 um to about 30 um. The distance between two adjacent through silicon vias is defined as D1, which is in a range from about 1.2 times the diameter of the through silicon via to about 6 times the diameter of the through silicon via according to an embodiment. The minimum distance between two adjacent through silicon vias is about 1.5 times the diameter of the through silicon via.

It should be noted while FIG. 2 shows the layout pattern 200 of through silicon vias is substantially hexagonal in shape. It is within the scope and spirit of various embodiments for the layout pattern 200 of through silicon vias to comprise other shapes similar to hexagon such as a polygon similar in shape but slightly different in interior angles between two adjacent sides. It should further be noted that a hexagonal layout pattern is merely an example, which should not unduly limit the scope of the claims. One of ordinary skill in the art would recognize many variations, alternatives, and modifications. For example, the layout pattern of through silicon vias can be any other appropriate shape, such as heptagon, pentagon, octagon, decagon, dodecagon and the like.

Figure 3:
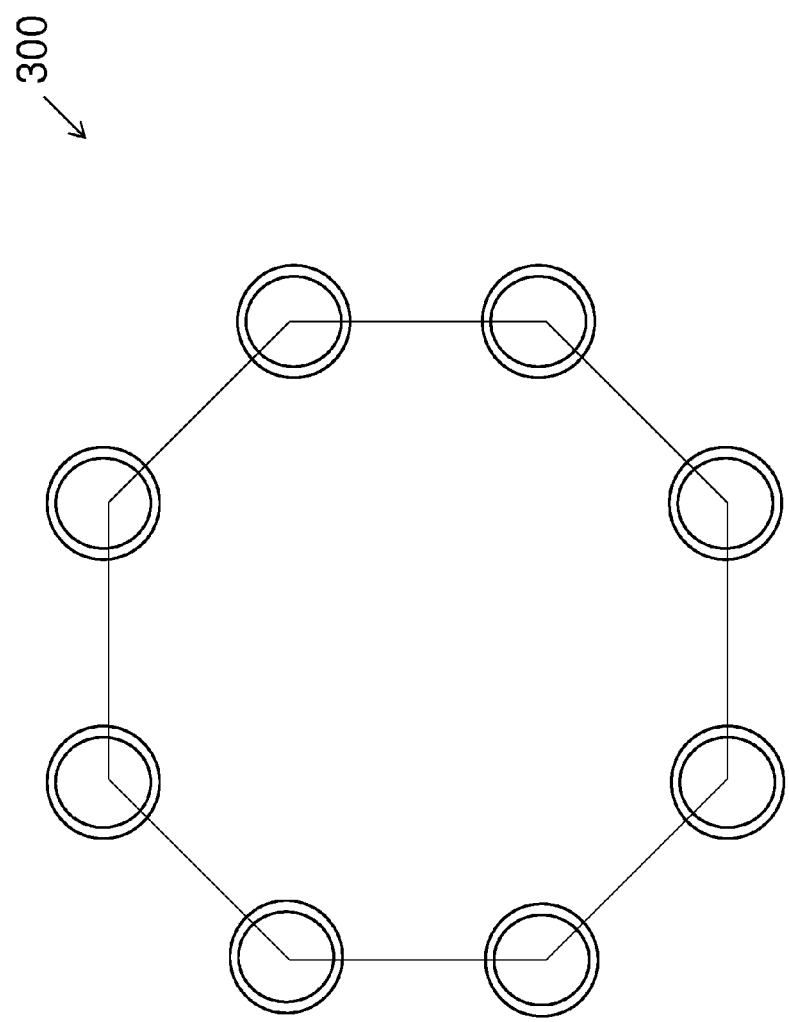
FIG. 3 illustrates an octagonal layout pattern of through silicon vias in accordance with an embodiment.

FIG. 3 illustrates an octagonal layout pattern of through silicon vias in accordance with an embodiment. The layout pattern 300 includes eight through silicon vias arranged in an octagonal shape. In particular, as shown in FIG. 3, eight through silicon vias are arranged at the eight apexes of the octagon respectively. The detailed parameters such as the distance between two adjacent through silicon vias are similar to those described with respect to FIG. 2, and hence are not discussed herein.

Figure 4:
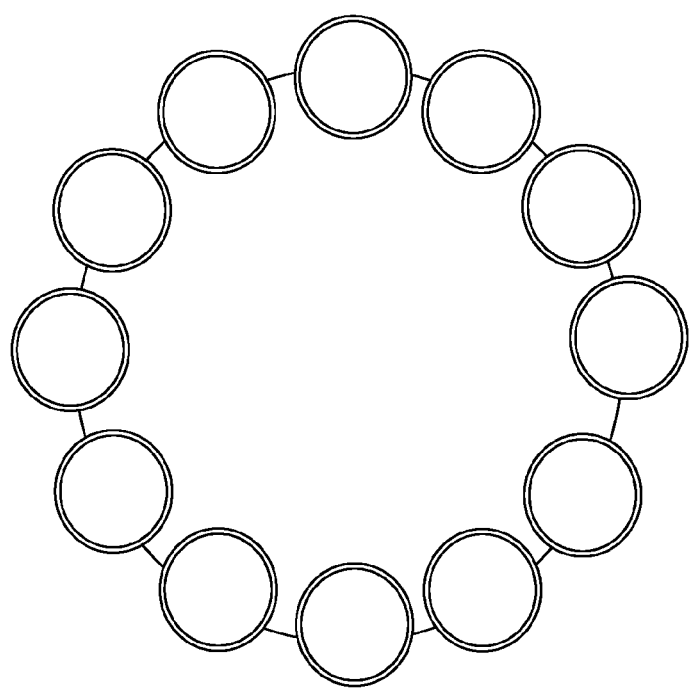
FIG. 4 illustrates a circular layout pattern of through silicon vias in accordance with an embodiment.

FIG. 4 illustrates a circular layout pattern of through silicon vias in accordance with an embodiment. The layout pattern 400 includes twelve through silicon vias arranged in a circular shape. It should be noted that while FIG. 4 shows a circular layout pattern, the layout pattern 400 may be a dodecagonal shape. More particularly, twelve through silicon vias are arranged at the twelve apexes of the dodecagon respectively. As the number of sides of a polygon (e.g., dodecagon) increases, the polygon may approximate to a circle as shown in FIG. 4. The detailed parameters such as the distance between two adjacent through silicon vias are similar to those described with respect to FIG. 2, and hence are not discussed to avoid unnecessary repetition.

Figure 5:
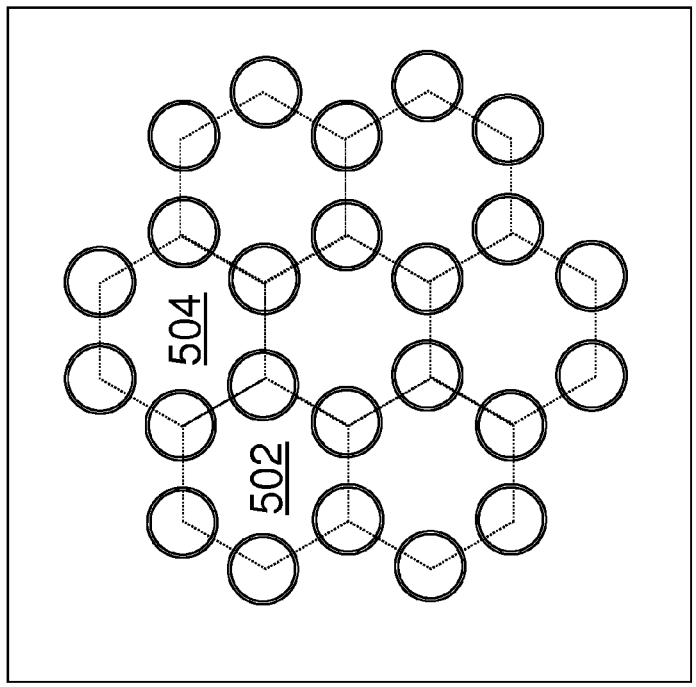
FIG. 5 illustrates a honeycomb shaped layout pattern of through silicon vias in accordance with an embodiment.

FIG. 5 illustrates a honeycomb shaped layout pattern of through silicon vias in accordance with an embodiment. The layout pattern 500 includes a plurality of through silicon vias arranged in a honeycomb shape. In particular, as shown in FIG. 5, six through silicon vias are arranged in a hexagon shape (e.g., hexagon structure 502). Adjacent hexagon structures (e.g., hexagon structure 502 and hexagon structure 504) share a side to form a honeycomb shaped layout pattern shown in FIG. 5. The detailed parameters such as the distance between two adjacent through silicon vias are similar to those described with respect to FIG. 2, and hence are not discussed herein.

Figure 6B:
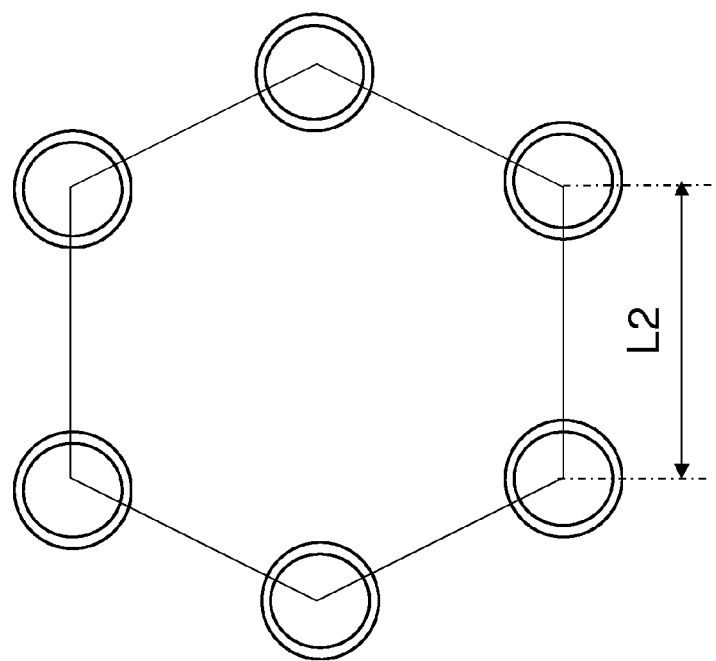
FIG. 6B illustrates a hexagonal layout pattern of six through silicon vias in accordance with an embodiment.
Figure 6A:
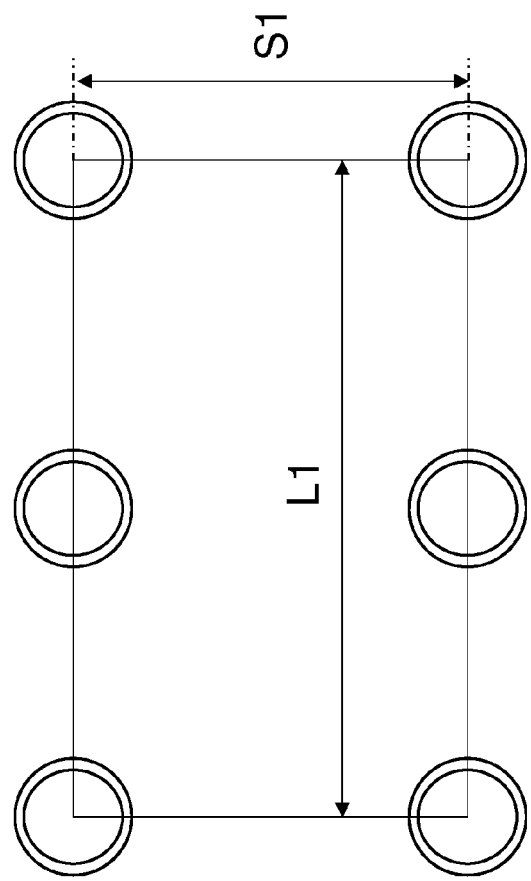
FIG. 6A illustrates a rectangular layout pattern of six through silicon vias in accordance with an embodiment.

FIG. 6A illustrates a rectangular layout pattern of six through silicon vias in accordance with an embodiment. Six through silicon vias are evenly placed along the sides of the rectangle. In accordance with an embodiment, the rectangle has two long sides and two short sides as shown in FIG. 6A. The long side L1 is of a length of 27.34 um. The short side S1 is of a length of 13.67 um. As a result, the area of the rectangle is about 374 um$^2$.

FIG. 6B illustrates a hexagonal layout pattern of six through silicon vias in accordance with an embodiment. Six through silicon vias are evenly placed at the six apexes of the hexagon respectively. In accordance with an embodiment, the hexagon has a same area as the rectangle shown in FIG. 6A. The side L2 of the hexagon is of a length of about 12 um. As a result, the area of the hexagon is about 374 um$^2$.

During the formation and subsequent thermal cycling of the through silicon vias shown in FIG. 6A and FIG. 6B, there are two types of stress, namely compressive strain and tensile strain. In order to prevent through silicon via induced stress from impacting the performance of active circuits, active circuits such as transistor are not allowed to be placed in an area adjacent to through silicon vias. Such an area is commonly referred to as a keep-out zone. In accordance with an embodiment, the keep-out zones of FIG. 6A and FIG. 6B are defined as areas having strain induced warpage in a range from about 0.01% to 0.1%.

In accordance with an embodiment, the keep-out zone of FIG. 6A inside the rectangle is about 232.3 um$^2$, which is about 62.1% of the area of the rectangle. The keep-out zone outside the rectangle is about 1254.32 um$^2$, which is about 335.5% of the area of the rectangle. In contrast, the keep-out zone of FIG. 6B inside the hexagon is about 169.48 um$^2$, which is about 45.3% of the area of the hexagon. The keep-out zone outside the hexagon is about 1193.56 um$^2$, which is about 319.1% of the area of the hexagon. In sum, for the region inside the through silicon via array, there is an improvement about 17% by employing the hexagonal layout pattern. For the region outside the through silicon via array, there is an improvement about 15% by employing the hexagonal layout pattern. Such improvements at both inside and outside the through silicon via array help to increase the available placement area upon which active circuits can be formed. As a result, the layout density of active circuits can be improved.

Figure 7B:
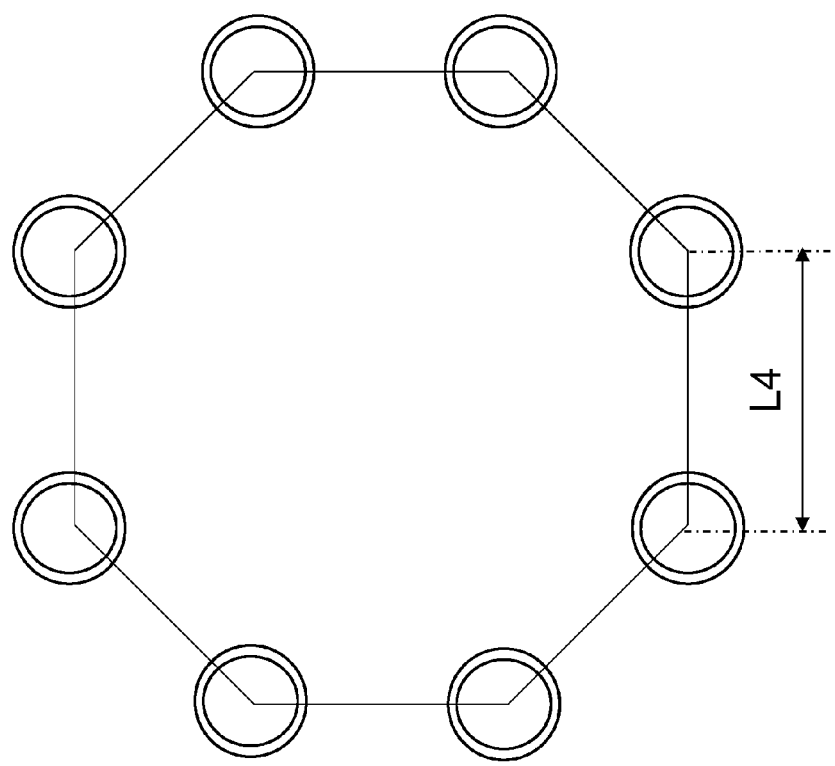
FIG. 7B illustrates an octagonal layout pattern of eight through silicon vias in accordance with an embodiment.
Figure 7A:
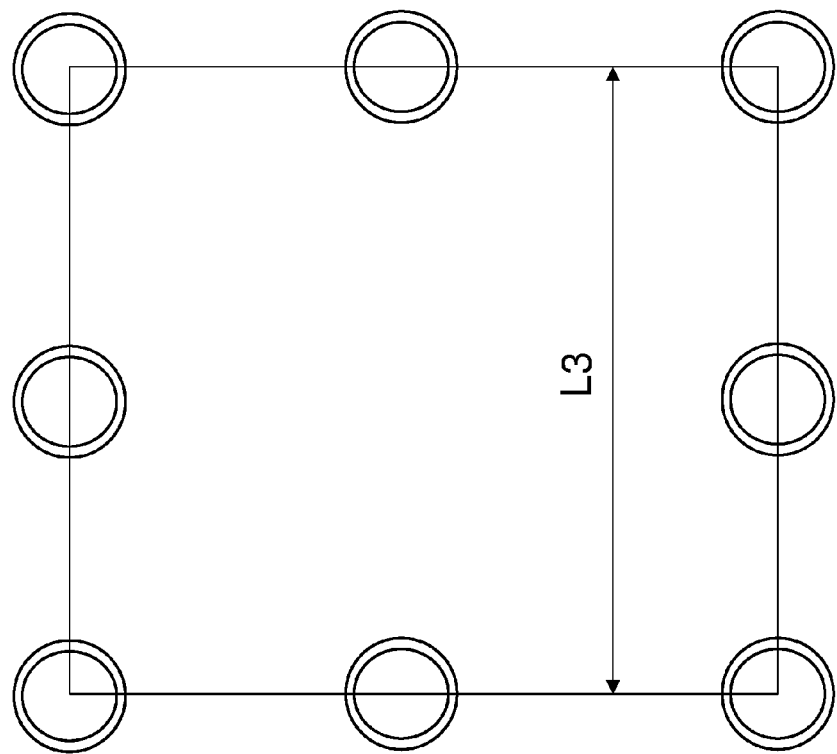
FIG. 7A illustrates a square layout pattern of eight through silicon vias in accordance with an embodiment.

FIG. 7A illustrates a square layout pattern of eight through silicon vias in accordance with an embodiment. Eight through silicon vias are evenly placed along the sides of the square. In accordance with an embodiment, the side L3 of the square is of a length of 26.4 um. As a result, the area of the square is about 697 um$^2$.

FIG. 7B illustrates an octagonal layout pattern of eight through silicon vias in accordance with an embodiment. Eight through silicon vias are placed at the eight apexes of the octagon respectively. In accordance with an embodiment, the octagon is so selected that it has a same area as the square shown in FIG. 7A. The side L4 of the octagon is of a length of about 12 um. As a result, the area of the hexagon is about 697 um$^2$.

In accordance with an embodiment, the keep-out zone of FIG. 7A inside the square is about 358.06 um$^2$, which is about 51.4% of the area of the square. The keep-out zone of FIG. 7A outside the rectangle is about 1377.44 um$^2$, which is about 197.6% of the area of the square. In contrast, the keep-out zone of FIG. 7B inside the octagon is about 276.22 um$^2$, which is about 39.63% of the area of the octagon. The keep-out zone of FIG. 7B outside the octagon is about 1270.54 um$^2$, which is about 182.3% of the area of the octagon. In sum, there is an improvement about 12% at the area inside the through silicon via array by employing the octagonal layout pattern. There is an improvement about 15% at the area outside the through silicon via array by employing the octagonal layout pattern. Such improvements further prove that the layout density of active circuits can be improved by employing an octagonal layout pattern.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
    a substrate with a first side and a second side, wherein a plurality of active circuits are formed adjacent to the first side of the substrate, and wherein the active circuits include at least one transistor; and
    a plurality of through silicon vias arranged in a polygon shape and extending from the first side to the second side, wherein the polygon shape has at least six sides, and wherein each through silicon via of the plurality of through silicon vias is placed at a corresponding apex of the polygon shape, and wherein all sides of the polygon shape are equal in length and all interior angles of the polygon shape are equal in size, and wherein an interior area surrounded by the plurality of through silicon vias and the at least six sides of the polygon shape is free of through silicon vias.

2. The apparatus of claim 1, wherein the through silicon via comprises:
an opening filled with conductive materials; and
sidewalls covered by a liner.

3. The apparatus of claim 1, wherein the polygon is a hexagon.

4. The apparatus of claim 1, wherein the polygon is an octagon.

5. The apparatus of claim 1, wherein the polygon is a dodecagon.

6. The apparatus of claim 1, wherein the polygon has more than eight sides and approximates to a circle.

7. The apparatus of claim 1, wherein:
the through silicon via has a diameter in a range from about 1 um to about 30 um.

8. The apparatus of claim 7, wherein:
a distance between two adjacent through silicon vias is in a range about 1.2 times the diameter of the through silicon via to about 6 times the diameter of the through silicon via.

9. An apparatus comprising:
a semiconductor substrate with a first side and an opposing second side;
a plurality of first through vias embedded in the semiconductor substrate, wherein the plurality of first through vias extend from the first side to the opposing second side, and wherein the plurality of first through vias form a polygon having at least six sides, and wherein all sides of the polygon are equal in length and all interior angles of the polygon are equal in size and wherein each of the plurality of first through vias is placed at a corresponding apex of the polygon, and wherein an interior area surrounded by the at least six sides and the plurality of first through vias of the polygon is free of through vias; and
a plurality of transistors formed adjacent to the first side of the semiconductor substrate, wherein the plurality of transistor are formed outside the polygon.

10. The apparatus of claim 9, wherein:
the polygon is a first hexagon having six apexes, each of which has a first through via.

11. The apparatus of claim 10, wherein the first through via comprises:
an opening;
a liner on sidewalls of the opening; and
a conductive material filled in the opening.

12. The apparatus of claim 11, further comprising:
the opening is of a diameter in a range from about 1 um to about 30 um.

13. The apparatus of claim 11, wherein:
the conductive material is copper.

14. The apparatus of claim 9, wherein:
the polygon has more than eight sides and approximates to a circle.

15. An apparatus comprising:
a substrate including a first side and a second side;
a plurality of active circuits adjacent to the first side of the substrate;
a plurality of first through vias in the substrate, wherein:
at least six first through vias form a first polygon, and wherein each of the at least six first through vias is placed at a corresponding apex of the first polygon, and wherein all sides of the first polygon are equal in length and all interior angles of the first polygon are equal in size, wherein an interior area surrounded by the at least six first through vias and the sides of the first polygon is free of through vias; and
a plurality of second through vias in the substrate, wherein:
at least six second through vias form a second polygon, and wherein each of the at least six second through vias is placed at a corresponding apex of the second polygon, and wherein all sides of the second polygon are equal in length and all interior angles of the second polygon are equal in size, and wherein the first polygon and the second polygon overlap each other on one side.

16. The apparatus of claim 15, wherein:
the first polygon has at least six sides; and
the second polygon has at least six sides.

17. The apparatus of claim 15, wherein:
the first polygon is a first hexagon; and
the second polygon is a second hexagon.

18. The apparatus of claim 15, further comprising:
a plurality of hexagons, wherein the plurality of hexagons form a honeycomb structure.

19. The apparatus of claim 15, wherein:
the first polygon is a first octagon; and
the second polygon is a second octagon.

20. The apparatus of claim 15, wherein:
the first polygon is a first dodecagon; and
the second polygon is a second dodecagon.

* * * * *

UNITED STATES PATENT AND TRADEMARK OFFICE
CERTIFICATE OF CORRECTION

PATENT NO. : 10,002,820 B2
APPLICATION NO. : 13/478815
DATED : June 19, 2018
INVENTOR(S) : Sun-Rong Jan et al.

Page 1 of 1

It is certified that error appears in the above-identified patent and that said Letters Patent is hereby corrected as shown below:

On the Title Page

Item (75) Inventors, Line 1, delete "(JP)" and insert --(TW)--.

Signed and Sealed this
Twenty-eighth Day of August, 2018

Andrei Iancu
*Director of the United States Patent and Trademark Office*